US012738303B2

(12) United States Patent
Ni et al.

(10) Patent No.: US 12,738,303 B2
(45) Date of Patent: Sep. 15, 2026

(54) CIRCUIT AND METHOD FOR OPTIMIZATION WITH DIGITAL ADDER, ANALOG ADDER, AND MULTIPLIER

(71) Applicant: HUAWEI TECHNOLOGIES CO., LTD., Shenzhen (CN)

(72) Inventors: Leibin Ni, Shenzhen (CN); Zhihang Wu, Boulogne Billancourt (FR); Wei Wu, Shenzhen (CN); Song Ma, Shenzhen (CN)

(73) Assignee: Huawei Technologies Co., LTD., Shenzhen (CN)

( * ) Notice: Subject to any disclaimer, the term of this patent is extended or adjusted under 35 U.S.C. 154(b) by 140 days.

(21) Appl. No.: 18/759,492

(22) Filed: Jun. 28, 2024

(65) Prior Publication Data

US 2024/0355372 A1 Oct. 24, 2024

Related U.S. Application Data

(63) Continuation of application No. PCT/CN2022/130963, filed on Nov. 9, 2022.

(30) Foreign Application Priority Data

Dec. 31, 2021 (CN) ........................ 202111676335.1

(51) Int. Cl.
*G11C 7/16* (2006.01)
*G11C 7/10* (2006.01)
*G11C 7/12* (2006.01)

(52) U.S. Cl.
CPC ............. *G11C 7/16* (2013.01); *G11C 7/1012* (2013.01); *G11C 7/12* (2013.01)

(58) Field of Classification Search
CPC ........... G11C 7/16; G11C 7/1012; G11C 7/12; G06F 2207/4814; G06F 7/5443
See application file for complete search history.

(56) References Cited

U.S. PATENT DOCUMENTS 7,080,115 B2 7/2006 Parhi et al.
2023/0146445 A1* 5/2023 Kraemer ............... G06F 7/5443 706/28

OTHER PUBLICATIONS

Bankman et al., "An Always-On 3.8 μJ/86% CIFAR-10 Mixed-Signal Binary CNN Processor With All Memory on Chip in 28-nm CMOS," IEEE Journal of Solid-State Circuits, Oct. 3, 2018, 15 pages.

(Continued)

*Primary Examiner* — Sultana Begum
(74) *Attorney, Agent, or Firm* — Fish & Richardson P.C.

(57) ABSTRACT

Examples of circuits, multiplier-adders, and circuit optimization methods are described. One example circuit includes a digital addition circuit and an analog addition circuit. The digital addition circuit is configured to perform bitwise digital accumulation on bits that belong to a first bit position range and that are in a plurality of groups of partial products. The plurality of groups of partial products are obtained by multiplying a plurality of first values by a plurality of second values. The first bit position range refers to S bit positions of a product value of one of the first values and one of the second values. S is a positive integer. The product value is obtained by performing bitwise accumulation after a group of partial products are shifted.

20 Claims, 8 Drawing Sheets

(56) References Cited

OTHER PUBLICATIONS

Si et al., “15.5 A 28nm 64Kb 6T SRAM Computing-in-Memory Macro with 8b MAC Operation for AI Edge Chips,” ISSCC2020, SESSION15, SRAMandCOMPUTE-IN-MEMORY, 15.5, May 18, 2020, 3 pages.

Xue et al., “A 22nm 4Mb 8b-Precision ReRAM Computing-in-Memory Macro with 11.91 to 195.7TOPS/W for Tiny AI Edge Devices,” IISSCC 2021, Session 16, Computation In Memory, 16.1, Jun. 27, 2021, 3 pages.

Chih et al., “An 89TOPS/W and 16.3TOPS/Mm 2 All-Digital SRAM-Based Full-Precision Compute-In Memory Macro in 22nm for Machine-Learning Edge Applications,” ISSCC 2021, Session 16, Computation In Memory, 16.4, May 14, 2021, 3 pages.

Wang et al., “A Novel Approximate Adder with Hybrid Structures,” China Academic Journal Electronic Publishing House, Dec. 6, 2017, 10 pages (with English translation).

* cited by examiner

CIRCUIT AND METHOD FOR OPTIMIZATION WITH DIGITAL ADDER, ANALOG ADDER, AND MULTIPLIER

CROSS-REFERENCE TO RELATED APPLICATIONS

This application is a continuation of International Application No. PCT/CN2022/130963, filed on Nov. 9, 2022, which claims priority to Chinese Patent Application No. 202111676335.1, filed on Dec. 31, 2021. The disclosures of the aforementioned applications are hereby incorporated by reference in their entireties.

TECHNICAL FIELD

This application relates to the field of electronic devices, and in particular, to a circuit, a multiplier-adder, and a circuit optimization method.

BACKGROUND

A multiplier-adder is a circuit structure in which two groups of values are multiplied by bit position to obtain product values, and then the product values are added by corresponding bit position. If the multiplier-adder implements addition by using a digital circuit, power consumption is high. If the multiplier-adder implements addition by using an analog circuit, precision is low.

SUMMARY

Embodiments of this application provide a circuit, a multiplier-adder, and a circuit optimization method, to achieve a balance between power consumption and precision when addition is implemented by using a circuit.

To achieve the foregoing objective, the following technical solutions are used in embodiments of this application.

According to a first aspect, a circuit is provided, including a digital addition circuit and an analog addition circuit. The digital addition circuit is configured to perform bitwise digital accumulation on bits that belong to a first bit position range and that are in a plurality of groups of partial products. The plurality of groups of partial products are obtained by multiplying a plurality of first values by a plurality of second values. The first bit position range refers to S bit positions of a product value of one of the first values and one of the second values. S is a positive integer. The product value is obtained by performing bitwise accumulation after a group of partial products are shifted. The analog addition circuit is configured to perform bitwise analog accumulation on analog parameters corresponding to values of bits that belong to a second bit position range and that are in the plurality of groups of partial products. The second bit position range refers to T bit positions that are of the product value and that do not overlap the first bit position range. T is a positive integer. S+T is less than or equal to a quantity of bit positions of the product value.

In the circuit provided in this embodiment of this application, the bitwise digital accumulation is performed, by using the digital addition circuit, on the bits that belong to the first bit position range and that are in the plurality of groups of partial products. The bitwise analog accumulation is performed, by using the analog addition circuit, on the analog parameters corresponding to the values of the bits that belong to the second bit position range and that are in the plurality of groups of partial products. The first bit position range refers to the S bit positions of the product value of one of the first values and one of the second values. The second bit position range refers to the T bit positions that are of the product value and that do not overlap the first bit position range. In a conventional technology, when accumulation is performed on values that are in a plurality of groups of partial products and that correspond to a same bit position of product values, a case in which some values are accumulated through digital accumulation and some other values are accumulated through analog accumulation occurs. In this case, for the bit position, because of the analog accumulation, an advantage of high precision of the digital accumulation is not reflected. In addition, because of the digital accumulation, an advantage of low power consumption of the analog accumulation is not reflected. However, in the circuit provided in this embodiment of this application, when accumulation is performed on values that are in the plurality of groups of partial products and that correspond to a same bit position of the product values, only one of the digital accumulation or the analog accumulation is used. In this way, precision and power consumption are controllable. To be specific, the digital accumulation is used if the precision needs to be improved, and the analog accumulation is used if the power consumption needs to be reduced. A balance between the power consumption and the precision is achieved during addition implemented by using the circuit.

In a possible implementation, the circuit further includes an analog-to-digital converter. The analog-to-digital converter is configured to perform analog-to-digital conversion on at least one summation analog parameter output by the analog addition circuit to obtain at least one second summation value. The summation analog parameter is converted to a digital parameter, so that it is convenient to combine the digital parameter with an output result of the digital addition circuit and output a combined result.

In a possible implementation, the circuit further includes a shift circuit. The shift circuit is configured to shift the at least one second summation value and at least one first summation value output by the digital addition circuit and sum values obtained after the shift. In this way, output results of the analog addition circuit and the digital addition circuit are combined and output.

In a possible implementation, the circuit further includes a multiplier. The multiplier is configured to multiply the plurality of first values by the plurality of second values respectively to obtain the plurality of groups of partial products. A manner of obtaining the partial product is provided.

In a possible implementation, positions of the bits in the first bit position range are higher than positions of the bits in the second bit position range. Because precision of the digital addition circuit is higher than precision of the analog addition circuit, using the digital addition circuit to calculate a higher-position bit of a product value helps ensure that precision of addition implemented by using the circuit is greater than a threshold.

In a possible implementation, the first bit position range refers to S highest bit positions of the product value, and the second bit position range refers to T bit positions that are of the product value and that are lower than the S bit positions. Because precision of the digital addition circuit is higher than precision of the analog addition circuit, using the digital addition circuit to calculate a higher-position bit of a product value helps ensure that precision of addition implemented by using the circuit is greater than a threshold.

In a possible implementation, S+T is less than a quantity of bit positions of the product value. Partial products corresponding to lower-position bits of the product value may not be calculated or may not be accumulated (that is, may be truncated), so that power consumption is further reduced.

In a possible implementation, the analog parameter is a current.

In a possible implementation, the multiplier includes a plurality of word lines, a plurality of bit lines, and a plurality of storage units in a memory. One word line is coupled to the plurality of storage units, and one bit line is coupled to the plurality of storage units. The analog addition circuit includes a plurality of buffer circuits respectively coupled to the plurality of bit lines. The plurality of storage units coupled to the word line are respectively configured to store one bit of one of the second values, and the word line is configured to input all bits of one of the first values. The plurality of storage units coupled to the bit line are respectively configured to output a current corresponding to one bit position in the partial product to a buffer circuit coupled to the bit line. The buffer circuit coupled to the bit line is configured to perform analog accumulation on the current, and output an accumulated current to a buffer circuit coupled to another bit line. The memory may be, for example, a static random access memory (SRAM), a register, a latch, an embedded flash (eFlash), a resistive random access memory (RRAM), or a phase change memory (PCM).

In a possible implementation, the circuit further includes a plurality of first switches coupled to the plurality of bit lines respectively. When a first switch is turned on, a bit line coupled to the first switch outputs a current to a buffer circuit coupled to the bit line. When the first switch is turned off, the bit line coupled to the first switch does not output a current to the buffer circuit coupled to the bit line. In this way, different summation analog parameters may be output by controlling the first switches to be turned on or off.

In a possible implementation, the analog parameter is a charge.

In a possible implementation, the multiplier includes a plurality of groups of AND gates, and the analog addition circuit includes a plurality of capacitors respectively coupled to output ends of the plurality of groups of AND gates. Two input ends of each AND gate are respectively configured to input an $M^{th}$ bit of one of the first values and an $N^{th}$ bit of one of the second values. Sums of M plus N corresponding to a same group of AND gates are the same. Capacitors coupled to output ends of a same group of AND gates are configured to perform analog accumulation on charges corresponding to a bit position in the plurality of groups of partial products. The analog addition circuit accumulates the partial products by accumulating charges corresponding to the partial products output by the multiplier.

In a possible implementation, capacitances of capacitors coupled to a same group of AND gates are the same. Therefore, a small capacitance may be used to improve precision. However, in a conventional addition circuit, to implement shift accumulation, a capacitance of a capacitor coupled to an output end of an AND gate is set to being in a two-fold increasing relationship. A larger capacitance indicates poorer precision and a larger area, resulting in poor precision and an excessively large area.

In a possible implementation, the analog addition circuit is further configured to: perform analog accumulation on analog parameters corresponding to values of first bit positions in the plurality of groups of partial products, multiply an accumulated analog parameter by a coefficient, and then add a value obtained by accumulating analog parameters corresponding to values of second bit positions in the plurality of groups of partial products to obtain a summation analog parameter. The first bit positions and the second bit positions are adjacent bit positions in the second bit position range. In this way, a stage quantity of the analog-to-digital converter can be fully utilized, to reduce power consumption of the circuit.

According to a second aspect, a multiplier-adder is provided, including the addition circuit according to any one of the first aspect and the implementations of the first aspect. For technical effects of the second aspect, refer to technical effects of any one of the first aspect and the implementations of the first aspect.

According to a third aspect, a circuit optimization method is provided, and is applied to the multiplier-adder according to the second aspect. The method includes: calculating power consumption of the multiplier-adder in each data pair, where the data pair includes a first bit position range in which digital accumulation is performed by the multiplier-adder and a second bit position range in which analog accumulation is performed by the multiplier-adder; and generating an optimized multiplier-adder based on an optimal data pair, where the optimal data pair is the first bit position range and the second bit position range when the power consumption of the multiplier-adder is the lowest. In addition to having the technical effects of any one of the first aspect and the implementations of the first aspect, in this case, the generated multiplier-adder has the lowest power consumption.

In a possible implementation, the method further includes: obtaining a candidate first bit position range based on precision of the multiplier-adder in different first bit position ranges, where the first bit position range is less than or equal to a quantity of bit positions of a product value, and the product value is obtained by multiplying two values for being input to the multiplier-adder; and obtaining a candidate second bit position range based on precision of the multiplier-adder in the candidate first bit position range and different second bit position ranges. The data pair includes the candidate first bit position range and the candidate second bit position range. Minimum precision of the multiplier-adder in the candidate first bit position range is less than minimum precision of the multiplier-adder in the candidate first bit position range and the different second bit position ranges. In this case, the generated multiplier-adder balances the precision and the power consumption.

According to a fourth aspect, a computer-readable storage medium is provided, and stores instructions. When the instructions are executed on a computer, the computer is enabled to perform the method according to any one of the third aspect and the implementations of the third aspect.

According to a fifth aspect, a computer program product including instructions is provided. When the instructions are executed on a computer, the computer is enabled to perform the method according to any one of the third aspect and the implementations of the third aspect.

For technical effects of the fourth aspect and the fifth aspect, refer to technical effects of any one of the third aspect and the implementations of the third aspect. Details are not described herein again.

DESCRIPTION OF EMBODIMENTS

It should be noted that the terms "first", "second", and the like in embodiments of this application are merely used to distinguish between features of a same type, and cannot be understood as being used to indicate relative importance, a quantity, a sequence, or the like.

Terms such as "example" or "for example" in embodiments of this application is used to represent giving an example, an illustration, or a description. Any embodiment or design scheme described as an "example" or "for example" in this application should not be explained as being more preferred or having more advantages than another embodiment or design scheme. Exactly, use of the terms "example", "for example", or the like is intended to present a related concept in a specific manner.

The terms "coupling" and "connection" in embodiments of this application should be understood in a broad sense. For example, the terms may refer to a physical direct connection, or may refer to an indirect connection implemented by using an electronic component, for example, a connection implemented by using a resistor, an inductor, a capacitor, or another electronic component.

First, some concepts in this application are described.

Partial product: A first value is multiplied by a second value to obtain a group of partial products, and each partial product may include a plurality of bits. When compression encoding is not performed, a partial product may be a value obtained by multiplying each bit in the first value by one bit in the second value, or a partial product may be a value obtained by multiplying each bit in the second value by one bit in the first value. When compression encoding is performed, a partial product may be a value obtained by multiplying the first value by the second value through compression encoding.

Product value: A first value is multiplied by a second value to obtain a group of partial products, the group of partial products are shifted and then accumulated in a bitwise manner, and a product value may be obtained after the first is multiplied value by the second value.

Multiply-add: Because a product value obtained after a first value is multiplied by a second value may be obtained by performing bitwise accumulation after a group of partial products are shifted, a sum of product values obtained by respectively multiplying a plurality of first values by a plurality of second values may be obtained by performing bitwise accumulation after a plurality of groups of partial products are shifted. This process is multiply-add.

Digital accumulation: The digital accumulation is summing values of two bits by using a digital circuit.

Analog accumulation: The analog accumulation is summing, by using an analog circuit, analog parameters corresponding to values of two bits.

Figure 1:
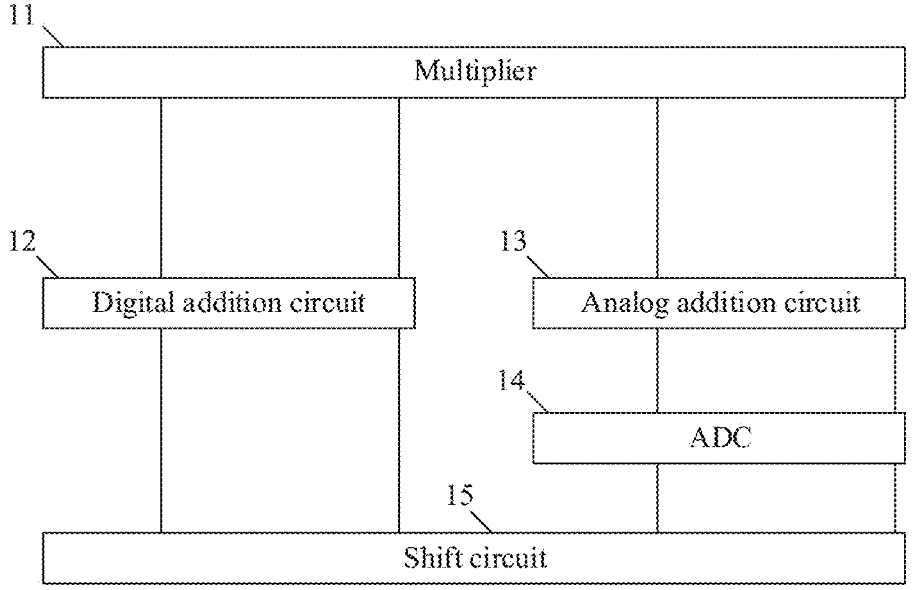
FIG. 1 is a schematic diagram of a structure of a multiplier-adder according to an embodiment of this application.

As shown in FIG. 1, an embodiment of this application provides a multiplier-adder (or referred to as a multiply and accumulate (MAC)), including a multiplier 11, a digital addition circuit 12, an analog addition circuit 13, an analog-to-digital converter (ADC) 14, and a shift circuit 15. K is a positive integer.

The multiplier 11 is configured to multiply a plurality of first values by a plurality of second values respectively to obtain a plurality of groups of partial products. The plurality of first values have a same quantity of bit positions, and the plurality of second values have a same quantity of bit positions.

In a possible implementation, when compression encoding is not performed, the multiplier 11 may be a bit multiplication multiplier, for example, an AND gate, or may be a storage unit in a memory. The memory may be, for example, a static random access memory (SRAM), a register, a latch, an embedded flash (eFlash), a resistive random access memory (RRAM), or a phase change memory (PCM). In this case, in a group of partial products obtained by multiplying a first value by a second value, a partial product may be a value obtained by multiplying each bit in the first value by one bit in the second value, for example, x1[3]y1[0], x1[2]y1[0], x1[1]y1[0], or x1[0]y1[0] in FIG. 2. Alternatively, a partial product may be a value obtained by multiplying each bit in the second value by one bit in the first value.

In another possible implementation, to reduce hardware overheads of the multiplier and reduce a quantity of partial products, the multiplier 11 may be a compression encoding multiplier, for example, a Booth encoding multiplier or a canonic signed digit (CSD) encoding multiplier. In this case, in a group of partial products obtained by multiplying a first value by a second value, a partial product may be a value obtained by multiplying the first value by the second value through compression encoding, for example, one of −Y, 2Y, −2Y, and Y in FIG. 8.

Figure 2:
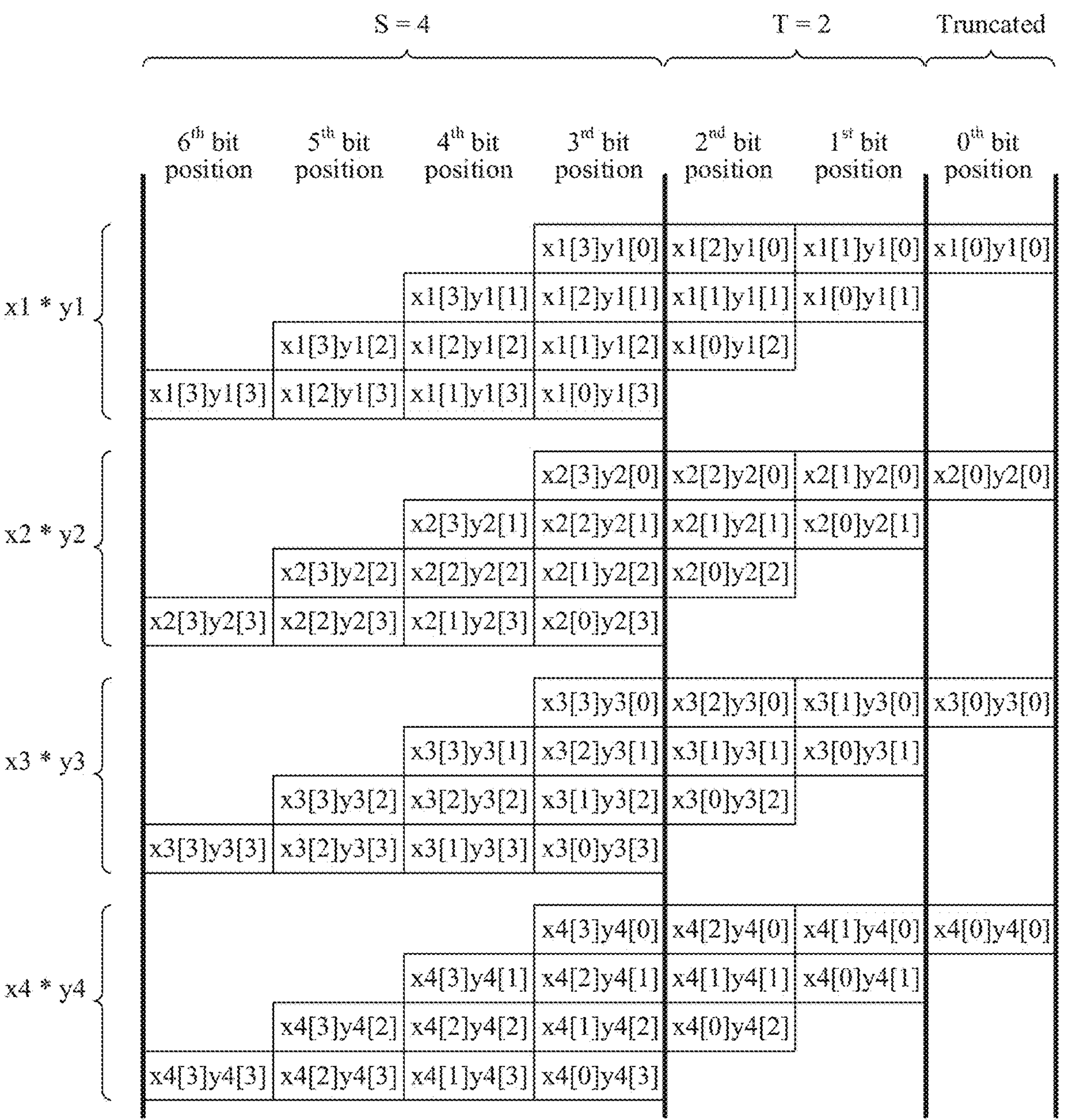
FIG. 2 is a schematic diagram of a plurality of groups of product values according to an embodiment of this application.
Figure 3:
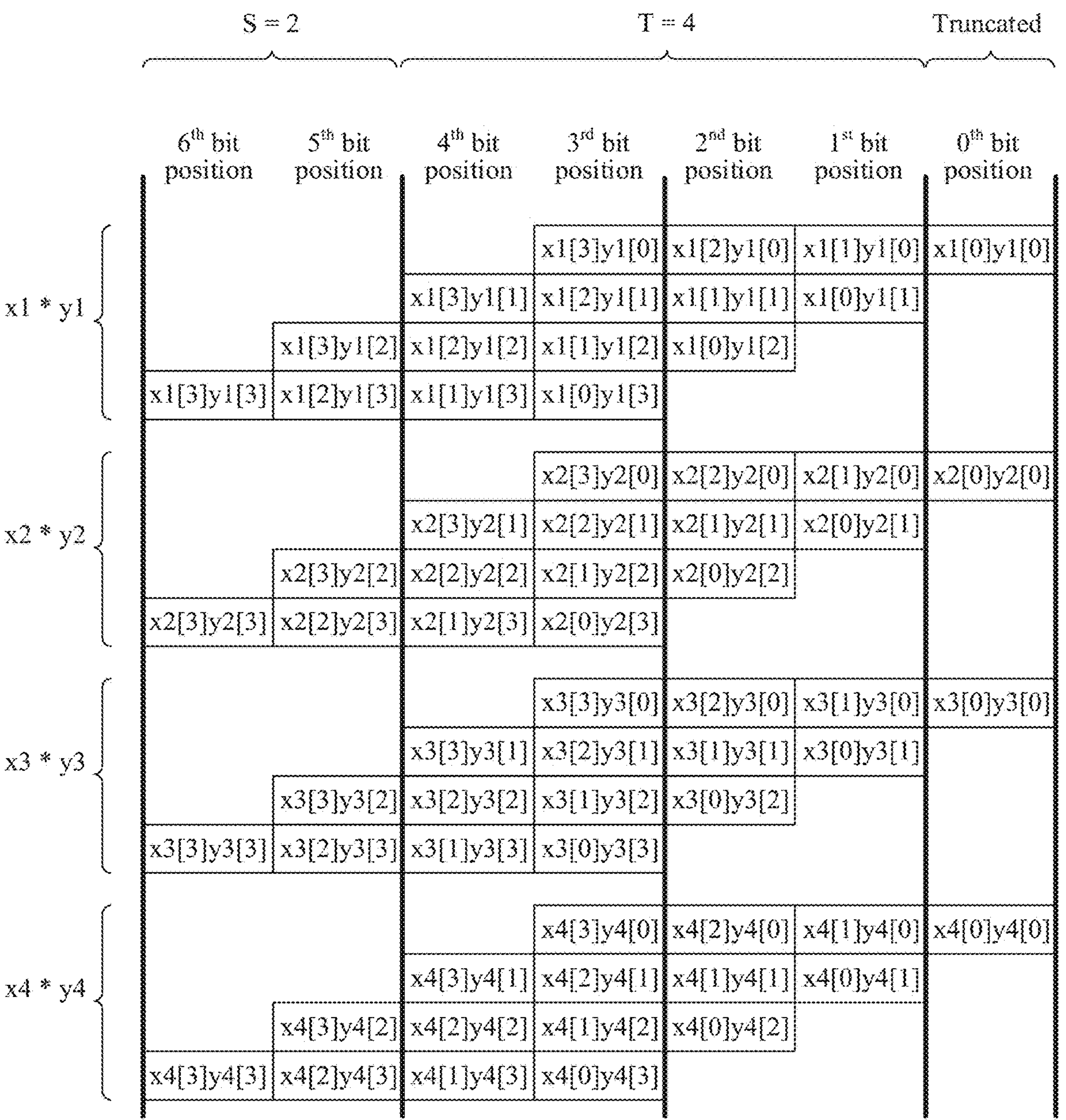
FIG. 3 is a schematic diagram of another plurality of groups of product values according to an embodiment of this application.
Figure 4:
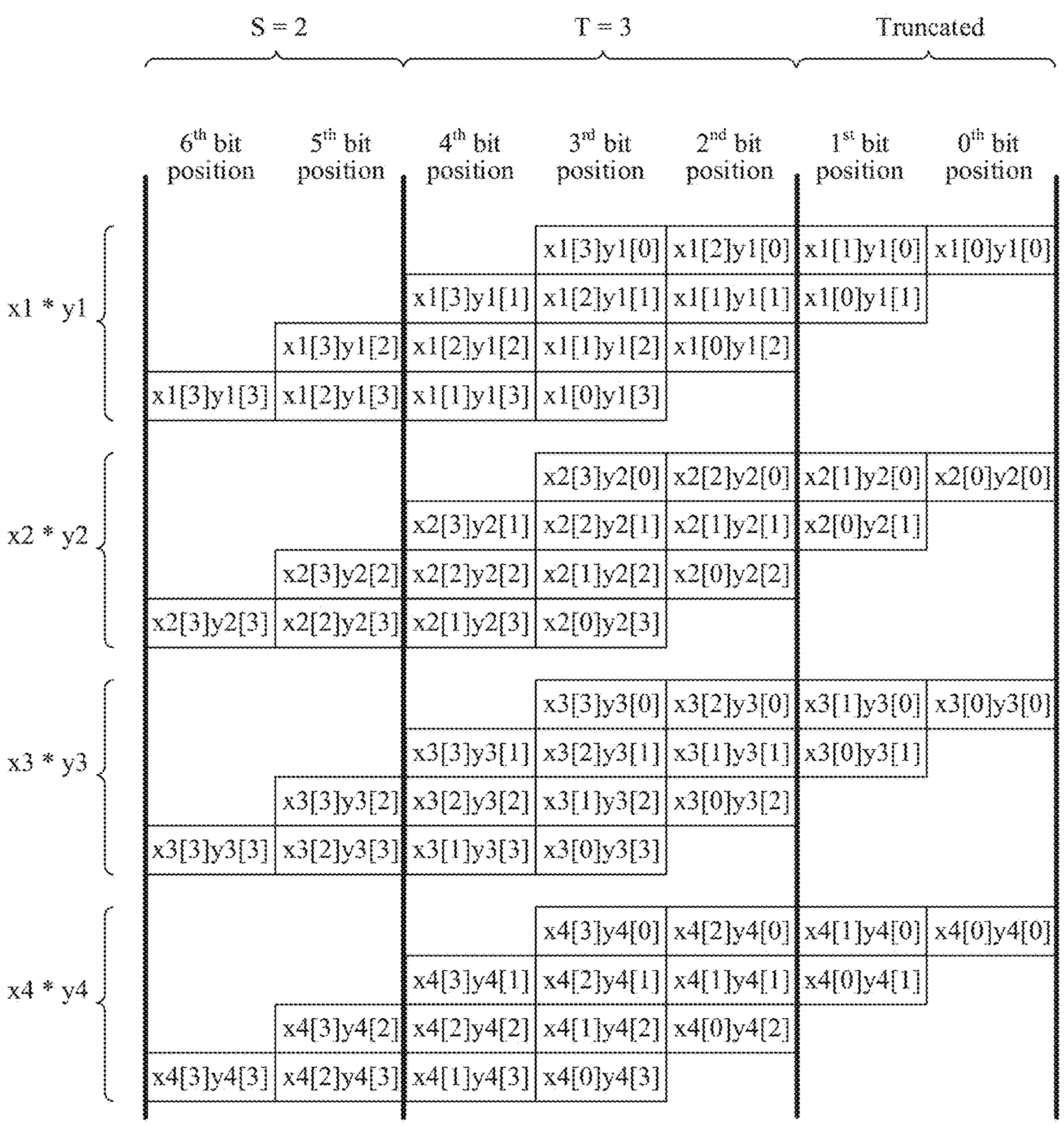
FIG. 4 is a schematic diagram of still another plurality of groups of product values according to an embodiment of this application.

It is assumed that a quantity of bit positions of the first value is E, and a quantity of bit positions of the second value is F. In this case, a quantity of bit positions of a product value of a first value and a second value is E+F. For example, the multiplier 11 is a bit multiplication multiplier. As shown in FIG. 2 to FIG. 4, it is assumed that a plurality of first values are x1 to x4 respectively, a plurality of second values are y1 to y4 respectively, and the first value and the second value each occupy positions of four bits. The four bits of the first value x1 may be respectively represented as x1[0], x1[1], x1[2], and x1[3], and the four bits of the second value y1 may be respectively represented as y1[0], y1[1], y1[2], and y1[3], and so on. A quantity of bit positions of a product value (for example, x1*y1, x2*y2, x3*y3, or x4*y4) of a first value and a second value is 4+4=8.

For example, as shown in FIG. 2 to FIG. 4, values that correspond to the $0^{th}$ bit positions of product values (referred to as product values for short below) of first values and second values and that are in a plurality of groups of partial products are x1[0]y1[0], x2 [0]y2 [0], x3 [0]y3 [0], and x4 [0]y4 [0] respectively. Values that correspond to the 1st bit positions of the product values and that are in the plurality of groups of partial products are x1[1]y1[0], x1[0]y1[1], x2 [1]y2 [0], x2 [0]y2 [1], x3 [1]y3 [0], x3 [0]y3 [1], x4 [1]y4 [0], and x4 [0]y4 [1] respectively. Values that correspond to the 2nd bit positions of the product values and that are in the plurality of groups of partial products are x1[2]y1[0], x1[1] y1[1], x1[0]y1[2], x2 [2]y2 [0], x2 [1]y1[1], x2 [0]y2 [2], x3 [2]y3 [0], x3 [1]y1[1], x3 [0]y3 [2], x4 [2]y4 [0], x4 [1]y1[1], and x4 [0]y4 [2] respectively. By analogy, values that correspond to the 6th bit positions of the product values and that are in the plurality of groups of partial products are x1[3]y1[3], x2 [3]y2 [3], x3 [3]y3 [3] and x4 [3]y4 [3] respectively.

The digital addition circuit 12 is configured to perform bitwise digital accumulation on bits that belong to a first bit position range and that are in the plurality of groups of partial products to obtain at least one (for example, S, where S is a positive integer) first summation value. A specific form of the digital addition circuit is not limited in this application. For example, the digital addition circuit may be an adder tree structure in a circuit, for example, an array multiplier, a carry-save adder (CSA), a carry-ripple adder (CRA), a Wallace tree multiplier, or an approximate adder. The first bit position range refers to S bit positions of a product value of a first value and a second value. Particularly, the first bit position range refers to S highest bit positions of a product value of a first value and a second value. Because precision of the digital addition circuit 12 is higher than precision of the analog addition circuit 13, using the digital addition circuit 12 to calculate a higher-position bit of a product value helps ensure that precision of the multiplier-adder is greater than a threshold.

For example, for FIG. 2, S=4. The digital addition circuit 12 may perform digital accumulation on 16 partial products corresponding to the 3rd bit positions of the product values to obtain a first summation value. The digital addition circuit 12 may perform digital accumulation on 12 partial products corresponding to the 4th bit positions of the product values to obtain a first summation value. The digital addition circuit 12 may perform digital accumulation on eight partial products corresponding to the 5th bit positions of the product values to obtain a first summation value. The digital addition circuit 12 may perform digital accumulation on four partial products corresponding to the 6th bit positions of the product values to obtain a first summation value. For FIG. 3 and FIG. 4, S=2. The digital addition circuit 12 may perform digital accumulation on eight partial products corresponding to the 5th bit positions of the product values to obtain a first summation value. The digital addition circuit 12 may perform digital accumulation on four partial products corresponding to the 6th bit positions of the product values to obtain a first summation value.

A corresponding analog parameter when a bit position is 0 is different from a corresponding analog parameter when a bit position is 1. The analog addition circuit 13 is configured to perform bitwise analog accumulation on analog parameters corresponding to values of bits that belong to a second bit position range and that are in the plurality of groups of partial products to obtain at least one (for example, T, where T is a positive integer) summation analog parameter. The analog parameter may be a charge, a current, a voltage, time, a quantity of pulses, or the like. This is not limited in this application. The second bit position range refers to T bit positions that are of the product value and that do not overlap the first bit position range. S+T is less than or equal to a quantity of bit positions of the product value. Positions of the bits in the first bit position range are higher than positions of the bits in the second bit position range. In a possible implementation, the second bit position range refers to T bit positions that are lower than S bit positions and that are of a product value of a first value and a second value. Because power consumption of the analog addition circuit 13 is lower than power consumption of the digital addition circuit 12, using the analog addition circuit 13 to calculate a lower-position bit of a product value helps reduce power consumption of the multiplier-adder, to achieve a balance between precision and power consumption.

For example, for FIG. 2, T=2. The analog addition circuit 13 may perform analog accumulation on analog parameters corresponding to eight partial products corresponding to the 1st bit positions of the product values to obtain a summation analog parameter. The analog addition circuit 13 may perform analog accumulation on analog parameters corresponding to 12 partial products corresponding to the 2nd bit positions of the product values to obtain a summation analog parameter. For FIG. 3, T=4. The analog addition circuit 13 may perform analog accumulation on analog parameters corresponding to eight partial products corresponding to the 1st bit positions of the product values to obtain a summation analog parameter. The analog addition circuit 13 may perform analog accumulation on analog parameters corresponding to 12 partial products corresponding to the 2nd bit positions of the product values to obtain a summation analog parameter. The analog addition circuit 13 may perform analog accumulation on analog parameters corresponding to 16 partial products corresponding to 3rd bit positions of the product values to obtain a summation analog parameter. The analog addition circuit 13 may perform analog accumulation on analog parameters corresponding to 12 partial products corresponding to the 4th bit positions of the product values to obtain a summation analog parameter. For FIG. 4, T=3. The analog addition circuit 13 may perform analog accumulation on analog parameters corresponding to 12 partial products corresponding to the 2nd bit positions of the product values to obtain a summation analog parameter. The analog addition circuit 13 may perform analog accumulation on analog parameters corresponding to 16 partial products corresponding to 3rd bit positions of the product values to obtain a summation analog parameter. The analog addition circuit 13 may perform analog accumulation on analog parameters corresponding to 12 partial products corresponding to the 4th bit positions of the product values to obtain a summation analog parameter.

Optionally, the analog addition circuit 13 may further perform analog accumulation on analog parameters corresponding to values of first bit positions in the plurality of groups of partial products, multiply an accumulated analog parameter by a coefficient, and then a value obtained by accumulating analog parameters corresponding to values of second bit positions in the plurality of groups of partial products to obtain a summation analog parameter. The first bit positions and the second bit positions are adjacent bit positions in the second bit position range. In this way, a stage quantity of the analog-to-digital converter 14 can be fully utilized, to reduce power consumption of the multiplier-adder. For example, as shown in FIG. 3, the analog addition circuit 13 may perform analog accumulation on analog parameters corresponding to the 4th bit positions, multiply an accumulated analog parameter by a coefficient 2, and then add a value obtained by accumulating analog parameters corresponding to the $3^{rd}$ bit positions to obtain a summation analog parameter. The analog addition circuit 13 may perform analog accumulation on analog parameters corresponding to the $2^{nd}$ bit positions, multiply an accumulated analog parameter by a coefficient 2, and then add a value obtained by accumulating analog parameters corresponding to the $1^{st}$ bit positions to obtain a summation analog parameter.

In addition, in a condition that the multiplier-adder satisfies precision, S+T may be less than or equal to a quantity of bit positions K of a product value of a first value and a second value, that is, S+T≤K. (S+T) highest bit positions of the product value are valid bit positions (that is, finally reserved). Partial products corresponding to (K−(S+T)) lowest bit positions of the product value may not be calculated or may not be accumulated (that is, may be truncated), so that power consumption is further reduced. For example, for FIG. 2 and FIG. 3, the $0^{th}$ bit positions of the product values of the first values and the second values are truncated. For FIG. 4, the $0^{th}$ bit positions and the $1^{st}$ bit positions of the product values of the first values and the second values are truncated.

The analog-to-digital converter 14 is configured to perform analog-to-digital conversion on at least one summation analog parameter output by the analog addition circuit 13 to obtain at least one (for example, T) second summation value, so that the second summation value and the first summation value are unified as summation values in a digital form. Because T summation analog parameters are used for analog-to-digital conversion, the state quantity of the analog-to-digital converter 14 is $2^T$. In comparison with a stage quantity $2^{E+F}$ of the analog-to-digital converter when all (E+F) bit positions use analog summation and a stage quantity $2^{S+T}$ of the analog-to-digital converter when all (S+T) bit positions use analog summing, the analog-to-digital converter 14 provided in this embodiment of this application can greatly reduce the stage quantity, reduce power consumption of the analog-to-digital converter, and can use an analog-to-digital converter having a smaller dynamic range and higher precision, so that precision of the multiplier-adder is improved and power consumption of the multiplier-adder is reduced, thereby achieving a balance between the power consumption and the precision of the multiplier-adder.

The shift circuit 15 is configured to perform shift on at least one first summation value and at least one second summation value, and then sum values obtained after the shift, to obtain target data. A quantity of bit positions of the target data is S+T. Because for all previously calculated summation values, bit positions at which the summation values are located in the target data are not considered, with reference to the bit positions at which the summation values are located in the target data, the summation values need to be shifted and then summed to obtain the target data. For example, it is assumed that a quantity of bit positions of the target data is 4, and four summation values are A, B, C, and D respectively. In this case, the finally obtained target data is 8*A+4*B+2*C+D.

The following describes several possible implementations of the multiplier 11 and the analog addition circuit 13.

Figure 5:
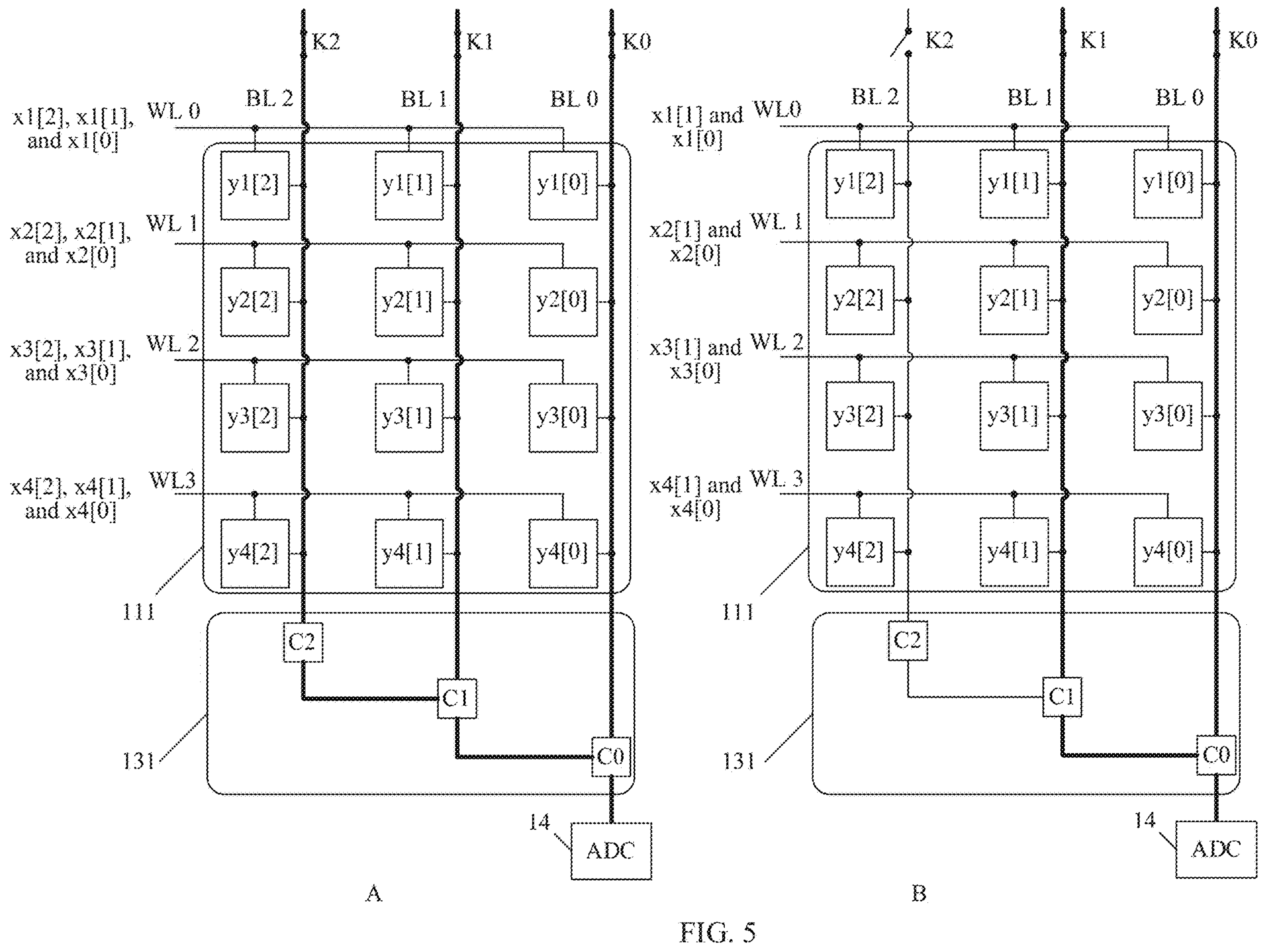
FIG. 5 is a schematic diagram of a structure of a multiplier according to an embodiment of this application.

In a possible implementation, the analog parameter is a current. The analog addition circuit 13 may accumulate partial products by accumulating currents corresponding to the partial products output by the multiplier 11. As shown in FIG. 5, the multiplier 11 may include a plurality of word lines (WLs) (for example, WL 0 to WL 3), a plurality of bit lines (BLs) (for example, BL 0 to BL 3), and a plurality of storage units (for example, an 8-transistor (8T) storage unit in an SRAM) 111 in a memory. One word line may be coupled to the plurality of storage units 111 (for example, one row of storage units 111), and one bit line may also be coupled to the plurality of storage units 111 (for example, one column of storage units 111). The plurality of storage units 111 coupled to the word line are respectively configured to store one bit of a second value. For example, a plurality of storage units 111 coupled to the word line WL 0 are respectively configured to store bits y1[0], y1[1], and y1[2] of a second value y1. One word line is configured to input bits of a first value in sequence in a time-division manner (in which a lower-position bit is first input and then a higher-position bit is input). For example, the word line WL 0 is configured to input bits x1[0], x1[1], and x1[2] of a first value x1 in a time-division manner. The plurality of storage units 111 coupled to the bit line are respectively configured to output, to the bit line, a current corresponding to one bit position in a partial product (that is, a partial product of multiplying one bit of the first value by one bit of the second value). For example, a plurality of storage units 111 coupled to the bit line BL 2 are respectively configured to output, to the bit line BL 2, currents corresponding to the partial products x1[0]*y1[2], x2 [0]*y2 [2], x3 [0]*y3 [2], and x4 [0]*y4 [2].

The analog addition circuit 13 includes a plurality of buffer circuits 131 (for example, C0 to C2) respectively coupled to the plurality of bit lines. A first buffer circuit 131 coupled to one bit line is configured to perform analog accumulation on the foregoing currents, and output an accumulated current to a second buffer circuit 131 coupled to another bit line. To be specific, the second buffer circuit 131 not only performs analog accumulation on currents in the coupled bit line, but also accumulates charges from the first buffer circuit 131. Finally, the second buffer circuit 131 outputs a summation analog parameter to the ADC 14. For example, as shown in A in FIG. 5, the buffer circuit C2 performs analog accumulation on the currents in the bit line BL 2, and outputs an accumulated current to the buffer circuit C1, and the buffer circuit C1 performs analog accumulation on currents in the bit line BL 1, and outputs an accumulated current to the buffer circuit C0. In this case, a summation analog parameter output by the buffer circuit C0 to the ADC 14 includes accumulation of the currents in the bit line BL 2, the bit line BL 1, and the bit line BL 0.

Optionally, the multiplier-adder may further include a plurality of first switches (for example, K0 to K2) respectively coupled to the plurality of bit lines. When a first switch is turned on, a bit line coupled to the first switch outputs a current to a buffer circuit 131 coupled to the bit line. When the first switch is turned off, the bit line coupled to the first switch does not output a current to the buffer circuit 131 coupled to the bit line. In this way, different summation analog parameters may be output by controlling the first switches to be turned on or off.

For example, as shown in A in FIG. 5, when the first switch K2, the first switch K1, and the first switch K0 are all turned on, the bit line BL 2, the bit line BL 1, and the bit line BL 0 may all output a current. y1[2], y2 [2], y3 [2], and y4 [2] are respectively stored in a storage unit coupled to the bit line BL 2. In a first periodicity, x1[0], x2 [0], x3 [0], and x4 [0] are respectively input to the four word lines (WL 0 to WL 3). Therefore, a summation analog parameter corresponding to a charge accumulated by the buffer circuit C2 coupled to the bit line BL 2 is x1[0]*y1[2]+x2 [0]*y2 [2]+x3 [0]*y3 [2]+x4 [0]*y4 [2]. y1[1], y2 [1], y3 [1], and y4 [1] are respectively stored in a storage unit coupled to the bit line BL 1. In a second periodicity, x1[1], x2 [1], x3 [1], and x4 [1] are respectively input to the four word lines (WL 0 to WL 3), and a charge accumulated by the buffer circuit C2 is transferred to the buffer circuit C1. Therefore, a summation analog parameter corresponding to the charge accumulated by the buffer circuit C1 is (x1[0]*y1[2])+x2 [0]*y2 [2]+x3 [0]*y3 [2]+x4 [0]*y4 [2])+ (x1[1]*y1[1]+x2 [1]*y2 [1]+x3 [1]*y3 [1]+x4 [1]*y4 [1]). y1[0], y2 [0], y3 [0], and y4 [0] are respectively stored in a storage unit coupled to the bit line BL 0. In a third periodicity, x1[2], x2 [2], x3 [2], and x4 [2] are respectively input to the four word lines (WL 0 to WL 3), and a charge accumulated by the buffer circuit C1 is transferred to the buffer circuit C0. Therefore, a summation analog parameter corresponding to the charge accumulated by the buffer circuit C0 is (x1[0]*y1[2]+x2 [0]*y2 [2]+x3 [0]*y3 [2]+x4 [0]*y4 [2])+ (x1[1]*y1[1]+x2 [1]*y2 [1]+x3 [1]*y3 [1]+x4 [1]*y4 [1]) (x1[2]*y1[0]+x2 [2]*y2 [0]+x3 [2]*y3 [0]+x4 [2] *y4 [0]). This circuit structure may output the summation analog parameter of the $2^{nd}$ bit positions of the product values in FIG. 2. The summation analog parameter corresponding to the charge accumulated by the buffer circuit C0 is output by the ADC 14, that is, a second summation value.

For example, as shown in B in FIG. 5, when the first switch K2 is turned off, and the first switch K1 and the first switch K0 are turned on, the bit line BL 2 coupled to the first switch K2 does not output a current. y1[1], y2 [1], y3 [1], and y4 [1] are respectively stored in a storage unit coupled to the bit line BL 1. In a first periodicity, x1[0], x2 [0], x3 [0], and x4 [0] are respectively input to the four word lines (WL 0 to WL 3). Therefore, a summation analog parameter corresponding to a charge accumulated by the buffer circuit C1 is (x1[0]*y1[1]+x2 [0]*y2 [1]+x3 [0]*y3 [1]+x4 [0]*y4 [1]). y1[0], y2 [0], y3 [0], and y4 [0] are respectively stored in a storage unit coupled to the bit line BL 0. In a second periodicity, x1[1], x2 [1], x3 [1], and x4 [1] are respectively input to the four word lines (WL 0 to WL 3), and a charge accumulated by the buffer circuit C1 is transferred to the buffer circuit C0. Therefore, a summation analog parameter corresponding to the charge accumulated by the buffer circuit C0 is (x1[0]*y1[1]+x2 [0]*y2 [1]+x3 [0]*y3 [1]+x4 [0]*y4 [1]) (x1[1]*y1[0]+x2 [1]*y2 [0]+x3 [1]*y3 [0]+x4 [1]*y4 [0]). This circuit structure may output the summation analog parameter of the $1^{st}$ bit positions of the product values in FIG. 2. The summation analog parameter corresponding to the charge accumulated by the buffer circuit C0 is output by the ADC 14, that is, a second summation value.

Figure 6:
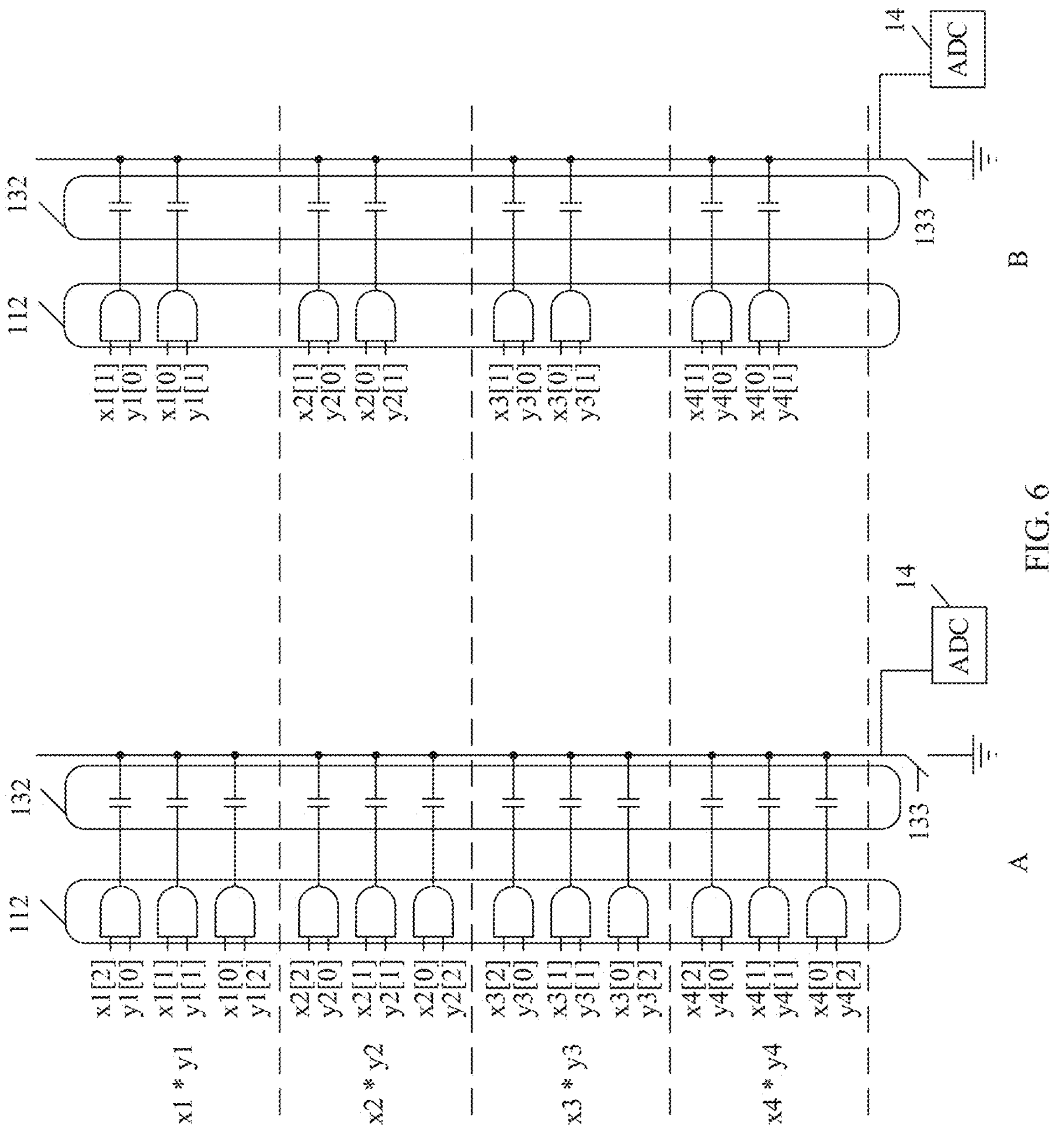
FIG. 6 is a schematic diagram of another structure of a multiplier according to an embodiment of this application.

In another possible implementation, the analog parameter is a charge. The analog addition circuit 13 may accumulate partial products by accumulating charges corresponding to the partial products output by the multiplier 11. As shown in FIG. 6, the multiplier 11 includes a plurality of groups of AND gates 112. The analog addition circuit 13 includes a plurality of capacitors 132 respectively coupled to output ends of the plurality of groups of AND gates 112, and a plurality of second switches 133 coupled to the plurality of capacitors 132. Capacitances of the plurality of capacitors 132 may be the same, so that a small capacitance may be used to improve precision. However, in a conventional multiplier-adder, to implement shift accumulation, a capacitance of a capacitor coupled to an output end of an AND gate is set to being in a two-fold increasing relationship. A larger capacitance indicates poorer precision and a larger area, resulting in poor precision and an excessively large area of the multiplier-adder.

Two input ends of each AND gate 112 are respectively configured to input an $M^{th}$ bit of a first value and an $N^{th}$ bit of a second value. An output end of the AND gate 112 is configured to output one bit of a partial product. Sums of M and N corresponding to a same group of AND gates are the same. Capacitor 132 coupled to output ends of a same group of AND gates are configured to perform analog accumulation on charges corresponding to a bit position in the plurality of groups of partial products. As shown in A in FIG. 6, when M=2, N=0, and M+N=2. For example, a first AND gate implements x1[2]*y1[0]. When M=1, N=1, and M+N=2. For example, a second AND gate implements x1[1]*y1[1]. When M=0, N=2, and M+N=2. For example, a third AND gate implements x1[0]*y1[2]. When the second switches 133 are turned off, output ends of a same group of AND gates are coupled to the ADC 14 via the capacitors 132, and output a summation analog parameter to the ADC 144. After outputting the summation analog parameter once, the second switches 133 are turned on to discharge the capacitors 132 and prepare for next analog accumulation.

For example, as shown in A in FIG. 6, this circuit structure may output the summation analog parameter of the $2^{nd}$ bit positions of the product values in FIG. 2. As shown in B in FIG. 6, this circuit structure may output the summation analog parameter of the $1^{st}$ bit positions of the product values in FIG. 2.

The multiplier 11 may further obtain the partial products by using various encoding circuits, for example, Booth encoding circuit and canonic signed digit (CSD) encoding circuit.

Figure 7:
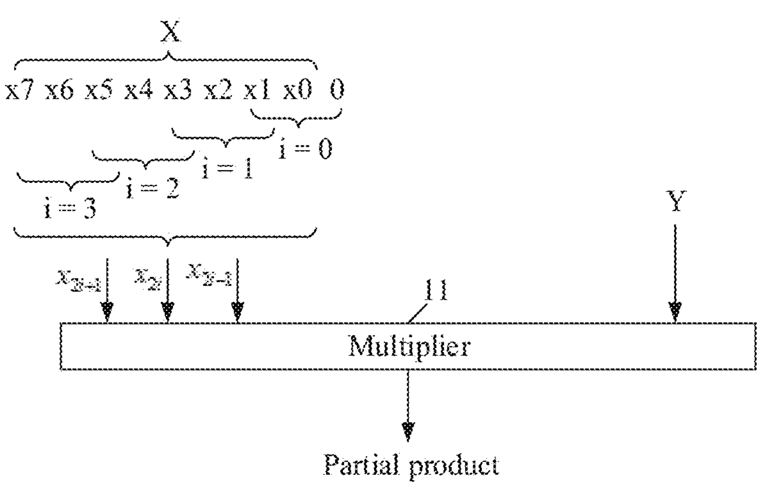
FIG. 7 is a schematic diagram of multiplying a first value by a second value to obtain a group of partial products by using Booth encoding according to an embodiment of this application.

For example, as shown in FIG. 7, a method of multiplying a first value by a second value by using Booth encoding to obtain a group of partial products is provided. The Booth encoding may include Radix-4 Booth encoding, Radix-8 Booth encoding, and the like. The Radix-4 Booth encoding is used as an example. Every three bits of a value in a first value X or a second value Y may be used as a group of inputs of the multiplier 11, the other value is used as another input of the multiplier 11, and compression encoding is performed on the input values by the multiplier 11 to obtain a plurality of partial products. For example, three bits $\{x_{2i+1}, x_{2i}, x_{2i-1}\}$ in the first value X are used as a group of inputs of the multiplier 11. i is an integer, and a value of i in FIG. 7 may range from 0 to 3. The second value Y is used as another input of the multiplier 11. Compression encoding is performed on the input values by the multiplier 11 to obtain a plurality of partial products.

A truth table of the multiplier 11 is shown in Table 1. A partial product Y indicates that the partial product is the same as the input Y. A partial product 2Y indicates that all bit positions of the input Y are shifted leftward by one bit position. A partial product −Y indicates that a complement of the input Y is taken (that is, negation is performed on Y and 1 is added). A partial product −2Y indicates that all bit positions of the input Y are shifted leftward by one bit position and then a complement is taken. A partial product 0 indicates that each bit is 0.

TABLE 1

| X | | | Partial |
|---|---|---|---|
| $X_{2i+1}$ | $X_{2i}$ | $X2_{i-1}$ | product |
| 0 | 0 | 0 | 0 |
| 0 | 0 | 1 | Y |
| 0 | 1 | 0 | Y |
| 0 | 1 | 1 | 2Y |
| 1 | 0 | 0 | −2Y |
| 1 | 0 | 1 | −Y |

TABLE 1-continued

| X | | | Partial |
|---|---|---|---|
| $X_{2i+1}$ | $X_{2i}$ | $X2_{i-1}$ | product |
| 1 | 1 | 0 | −Y |
| 1 | 1 | 1 | 0 |

Figure 8:
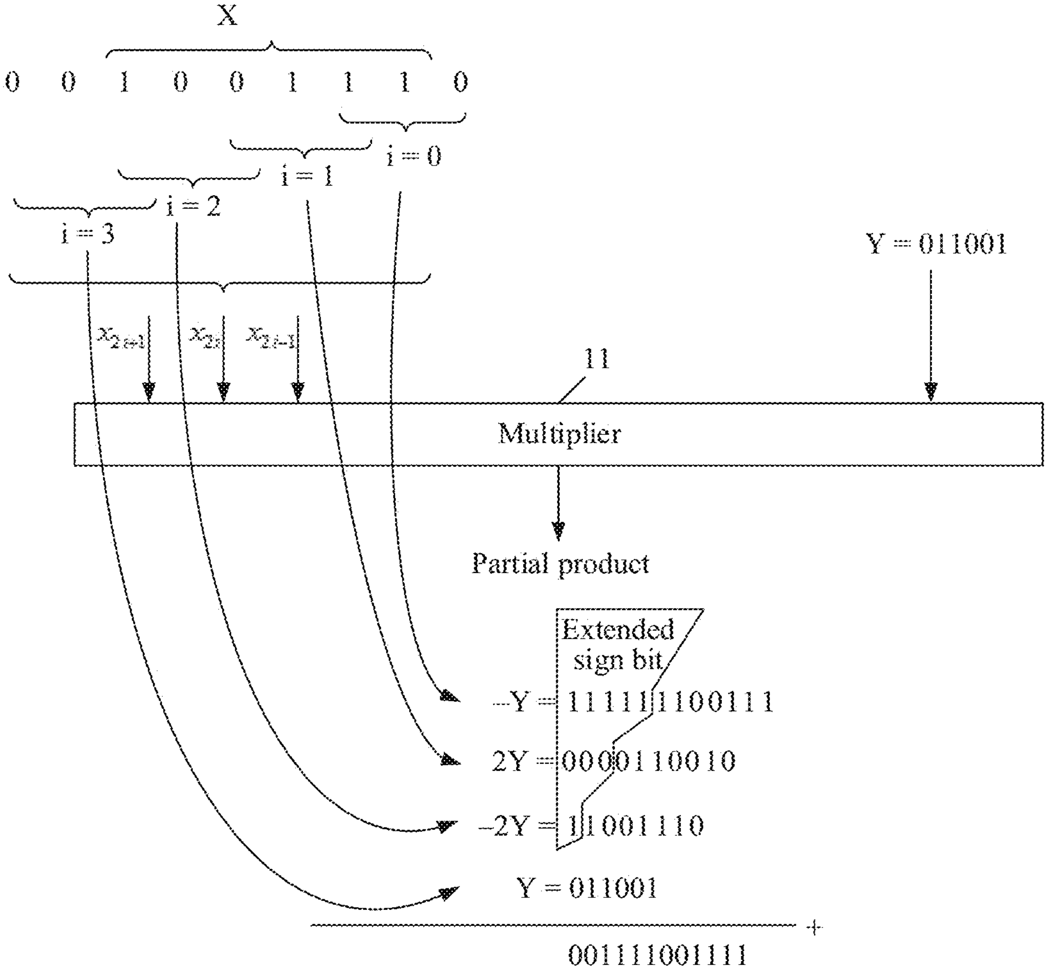
FIG. 8 is another schematic diagram of multiplying a first value by a second value to obtain a group of partial products by using Booth encoding according to an embodiment of this application.

As shown in FIG. 8, assuming that a first value X=100111, and a second value Y=011001, four groups $\{x_{2i+1}, x_{2i}, x_{2i-1}\}$ of the first value are {1, 1, 0} (when i=0), {0, 1, 1} (when i=1), {1, 0, 0} (when i=2), and {0, 0, 1} (when i=3) respectively. A plurality of corresponding partial products, which are −Y, 2Y, −2Y, and Y respectively, may be obtained by querying Table 1. After sign bit positions of these partial products are extended, a plurality of partial products, −Y=111111100111, 2Y=0000110010, −2Y=11001110, and Y=011001, may be obtained. A product value of the first value X and the second value Y, that is, X*Y=001111001111, may be obtained by accumulating these partial products.

Figures 9, 10:
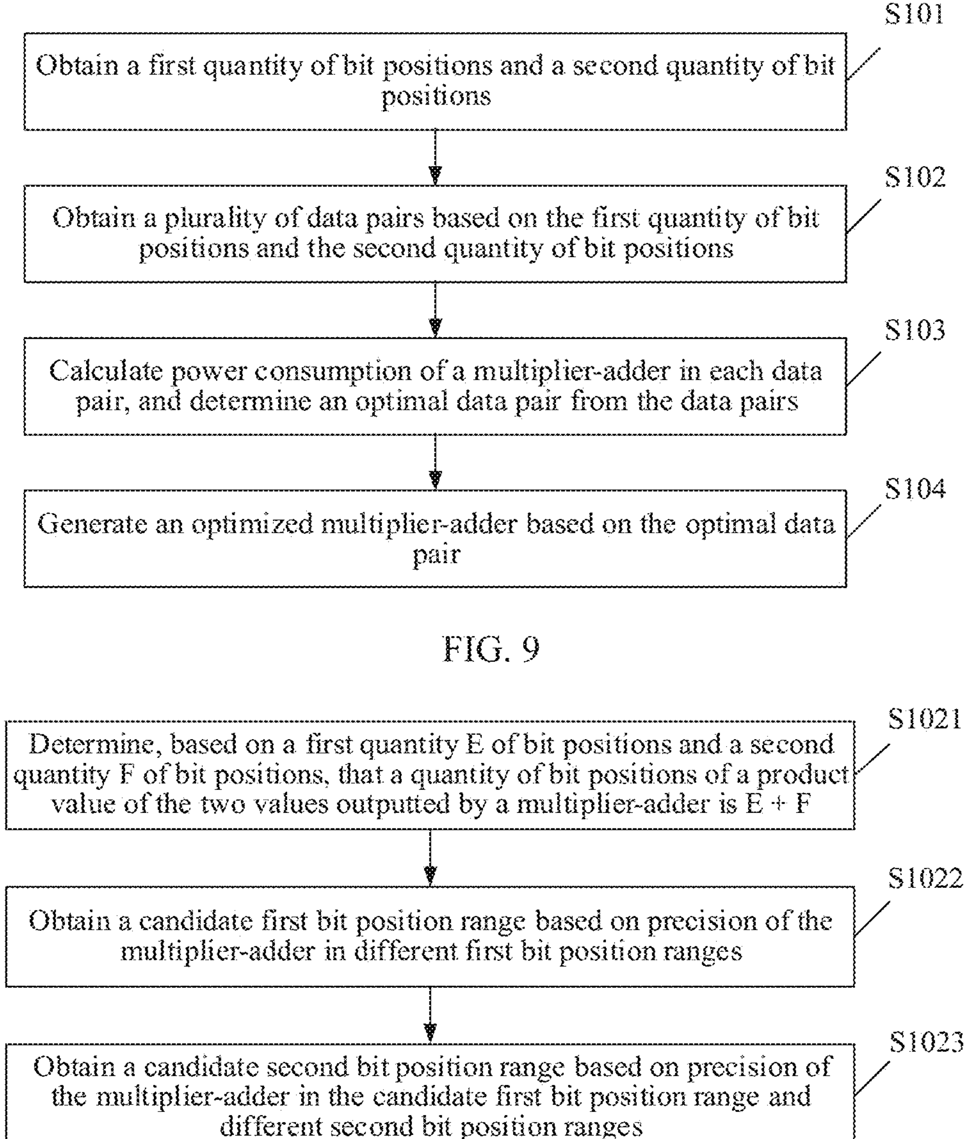
FIG. 9 is a schematic flowchart of a circuit optimization method according to an embodiment of this application.
FIG. 10 is a schematic flowchart of another circuit optimization method according to an embodiment of this application.

An embodiment of this application further provides a circuit optimization method, to generate and optimize the foregoing multiplier-adder, and may be applied to electronic design automation (EDA). As shown in FIG. 9, the method includes the following steps.

S101: Obtain a first quantity of bit positions and a second quantity of bit positions.

The first quantity of bit positions and the second quantity of bit positions each refer to a quantity of bit positions of a product value obtained by multiplying two values (for example, the first value and the second value described above).

S102: Obtain a plurality of data pairs based on the first quantity of bit positions and the second quantity of bit positions.

Precision of the multiplier-adder described above in each data pair is greater than a threshold. The data pair includes a first bit position range in which digital accumulation is performed by the multiplier-adder and a second bit position range in which analog accumulation is performed by the multiplier-adder. The first bit position range is less than or equal to a quantity of bit positions of the product value.

Specifically, as shown in FIG. 10, step S102 may include the following step.

S1021: Determine, based on a first quantity E of bit positions and a second quantity F of bit positions, that a quantity of bit positions of a product value of the two values output by the multiplier-adder is E+F.

S1022: Obtain a candidate first bit position range based on precision of the multiplier-adder in different first bit position ranges.

For example, in an initial state, the first bit position range in which digital accumulation is performed is set to being equal to the quantity E+F of bit positions of the product value, and the precision of the multiplier-adder is calculated. Then, the first bit position range is gradually decreased and the precision of the multiplier-adder is calculated. If the precision of the multiplier-adder is greater than a first threshold, the first bit position range is added to the foregoing set, and the first bit position range is stopped being added to the set until the precision of the multiplier-adder is not greater than the first threshold. The set includes all candidate first bit position ranges.

It should be noted that when the precision of the multiplier-adder is calculated, the first bit position range in which digital accumulation is performed refers to S highest bit positions of the product value of the two values. The precision of the multiplier-adder may be expressed by an error between multiplier-adders that completely use (that is, (E+F) bit positions) digital accumulation.

S1023: Obtain a candidate second bit position range based on precision of the multiplier-adder in the candidate first bit position range and different second bit position ranges.

A candidate first bit position range is selected from the set. Precision of the multiplier-adder in the candidate first bit position range and the different second bit position ranges is calculated. The candidate second bit position range (the smallest second bit position range when the precision is greater than a second threshold) and the candidate first bit position range are added to a data pair. Minimum precision of the multiplier-adder in the candidate first bit position range is less than minimum precision of the multiplier-adder in the candidate first bit position range and the different second bit position ranges.

For example, after a candidate first bit position range S is selected from the set, a second bit position range T on which analog accumulation is performed is set to E+F−S. Then the second bit position range T on which analog accumulation is performed is gradually decreased, and precision of the multiplier-adder is calculated until the precision of the multiplier-adder is not greater than the second threshold (where the second threshold is greater than the first threshold). In this way, the minimum second bit position range in which analog accumulation is performed may be determined.

Because there may be a plurality of candidate first bit position ranges in the set, there may also be a plurality of determined data pairs.

S103: Calculate power consumption of the multiplier-adder in each data pair, and determine an optimal data pair from the data pairs.

The power consumption of the multiplier-adder mainly includes power consumption of a digital addition circuit (which is affected by the first bit position range in which digital accumulation is performed), power consumption of an analog addition circuit (which is affected by a quantity T of bit positions on which analog accumulation is performed), and power consumption of an ADC (which is affected by a quantity of bit positions of a digital parameter output by the ADC). Particularly, the power consumption of the ADC is not in a linear relationship with the quantity of bit positions of the digital parameter output by the ADC. For example, power consumption of an ADC of which output digital parameter is 5 bits is only 20% higher than power consumption of an ADC of which output digital parameter is 4 bits. However, power consumption of an ADC of which output digital parameter is 12 bits is many times higher than power consumption of an ADC of which output digital parameter is 11 bits.

Therefore, factors affecting the power consumption need to be calculated comprehensively, to determine a data pair (the first bit position range and the second bit position range) when the overall power consumption is the lowest as the optimal data pair.

S104: Generate an optimized multiplier-adder based on the optimal data pair.

After the optimal data pair is determined, the multiplier-adder described above may be generated, and the multiplier-adder mainly affects a quantity of bit positions of the digital addition circuit and a quantity of bit positions of the analog addition circuit.

It should be noted that the multiplier-adder in this application may be used in an architecture in which multiplication and accumulation are implemented based on in-memory computing or near-memory computing of a storage unit. The storage unit may be a storage unit in a memory such as a static random access memory (SRAM), a register, a latch, an embedded flash (eFlash), a resistive random access memory (RRAM), or a phase change memory (PCM). The multiplier-adder may be used in a scenario in which the second value does not change frequently but the first value changes frequently, for example, a flow processing acceleration chip or a neural network acceleration chip. The multiplier-adder may be further used in a scenario in which both the second value and the first value change frequently, for example, a signal processing chip in the communications field or a low-delay multiply-add kernel in a neural network chip.

According to the circuit, the multiplier-adder, and the circuit optimization method provided in embodiments of this application, in the addition circuit provided in embodiments of this application, the bitwise digital accumulation is performed, by using the digital addition circuit, on the bits that belong to the first bit position range and that are in the plurality of groups of partial products. The bitwise analog accumulation is performed, by using the analog addition circuit, on the analog parameters corresponding to the values of the bits that belong to the second bit position range and that are in the plurality of groups of partial products. The first bit position range refers to the S bit positions of the product value of one of the first values and one of the second values. The second bit position range refers to the T bit positions that are of the product value and that do not overlap the first bit position range. In a conventional technology, when accumulation is performed on values that are in a plurality of groups of partial products and that correspond to a same bit position of product values, a case in which some values are accumulated through digital accumulation and some other values are accumulated through analog accumulation occurs. In this case, for the bit position, because of the analog accumulation, an advantage of high precision of the digital accumulation is not reflected. In addition, because of the digital accumulation, an advantage of low power consumption of the analog accumulation is not reflected. However, in the addition circuit provided in embodiments of this application, when accumulation is performed on values that are in the plurality of groups of partial products and that correspond to a same bit position of the product values, only one of the digital accumulation or the analog accumulation is used. In this way, precision and power consumption are controllable. To be specific, the digital accumulation is used if the precision needs to be improved, and the analog accumulation is used if the power consumption needs to be reduced. Therefore, a balance between the power consumption and the precision is achieved during addition implemented by using the circuit.

An embodiment of this application further provides a computer-readable storage medium, storing instructions. When the instructions are executed on a computer, the computer is enabled to perform the methods in FIG. 9 and FIG. 10.

An embodiment of this application further provides a computer program product including instructions. When the instructions are executed on a computer, the computer is enabled to perform the methods in FIG. 9 and FIG. 10.

It should be understood that sequence numbers of the foregoing processes do not mean execution sequences in various embodiments of this application. The execution sequences of the processes should be determined according to functions and internal logic of the processes, and should not be construed as any limitation on the implementation processes of embodiments of this application.

A person of ordinary skill in the art may be aware that in combination with the examples described in embodiments disclosed in this specification, modules and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that for the purpose of convenient and brief description, for a detailed working process of the foregoing system, apparatus, and module, refer to a corresponding process in the foregoing method embodiments, and details are not described herein again.

In the several embodiments provided in this application, it should be understood that the disclosed system, device, and method may be implemented in other manners. For example, the described device embodiment is merely an example. For example, division into the modules is merely logical function division and may be other division in an actual implementation. For example, a plurality of modules or components may be combined or integrated into another device, or some features may be ignored or not performed. In addition, the displayed or discussed mutual couplings or direct couplings or communication connections may be implemented through some interfaces. The indirect couplings or communication connections between the devices or modules may be implemented in electronic, mechanical, or other forms.

The modules described as separate components may or may not be physically separate, and components displayed as modules may or may not be physical modules, may be located in one device, or may be distributed on a plurality of devices. Some or all the modules may be selected according to actual needs to achieve the objectives of the solutions of embodiments.

In addition, functional modules in embodiments of this application may be integrated into one device, or each of the modules may exist alone physically, or two or more modules are integrated into one device.

All or some of the foregoing embodiments may be implemented by using software, hardware, firmware, or any combination thereof. When a software program is used to implement embodiments, all or some of embodiments may be implemented in a form of a computer program product. The computer program product includes one or more computer instructions. When the computer program instructions are loaded and executed on a computer, all or some of the procedure or functions according to embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A circuit, comprising a digital addition circuit and an analog addition circuit, wherein:

the digital addition circuit is configured to perform bitwise digital accumulation on bits that belong to a first bit position range and that are in a plurality of groups of partial products, wherein the plurality of groups of partial products are obtained by multiplying a plurality of first values by a plurality of second values, the first bit position range refers to S bit positions of a product value of one of the first values and one of the second values, S is a positive integer, and the product value is obtained by performing bitwise accumulation after a group of partial products are shifted; and the analog addition circuit is configured to perform bitwise analog accumulation on analog parameters corresponding to values of bits that belong to a second bit position range and that are in the plurality of groups of partial products, wherein the second bit position range refers to T bit positions that are of the product value and that do not overlap the first bit position range, T is a positive integer, and S+T is less than or equal to a quantity of bit positions of the product value.

2. The circuit according to claim 1, further comprising an analog-to-digital converter, wherein the analog-to-digital converter is configured to perform analog-to-digital conversion on at least one summation analog parameter output by the analog addition circuit to obtain at least one second summation value.

3. The circuit according to claim 2, further comprising a shift circuit, wherein the shift circuit is configured to:

shift the at least one second summation value and at least one first summation value output by the digital addition circuit; and sum values obtained after the shift.

4. The circuit according to claim 1, further comprising a multiplier, wherein the multiplier is configured to multiply the plurality of first values by the plurality of second values respectively to obtain the plurality of groups of partial products.

5. The circuit according to claim 1, wherein positions of the bits in the first bit position range are higher than positions of the bits in the second bit position range.

6. The circuit according to claim 5, wherein the first bit position range refers to S highest bit positions of the product value, and the second bit position range refers to T bit positions that are of the product value and that are lower than the S bit positions.

7. The circuit according to claim 1, wherein S+T is less than the quantity of bit positions of the product value.

8. The circuit according to claim 1, wherein an analog parameter of the analog parameters is a current.

9. The circuit according to claim 4, wherein:

the multiplier comprises a plurality of word lines, a plurality of bit lines, and a plurality of storage units in a memory, wherein one word line is coupled to the plurality of storage units, and one bit line is coupled to the plurality of storage units;

the analog addition circuit comprises a plurality of buffer circuits respectively coupled to the plurality of bit lines;

the plurality of storage units coupled to the word line are respectively configured to store one bit of one of the second values, and the word line is configured to input all bits of one of the first values; and the plurality of storage units coupled to the bit line are respectively configured to output a current corresponding to one bit position in the partial product to a buffer circuit coupled to the bit line, and the buffer circuit coupled to the bit line is configured to perform analog accumulation on the current.

10. The circuit according to claim 9, further comprising a plurality of first switches coupled to the plurality of bit lines respectively.

11. The circuit according to claim 1, wherein an analog parameter of the analog parameters is a charge.

12. The circuit according to claim 4, wherein:

the multiplier comprises a plurality of groups of AND gates, and the analog addition circuit comprises a plurality of capacitors respectively coupled to output ends of the plurality of groups of AND gates; and two input ends of each AND gate are respectively configured to input an $M^{th}$ bit of one of the first values and an $N^{th}$ bit of one of the second values, sums of M and N that correspond to a same group of AND gates are the same, and capacitors coupled to output ends of a same group of AND gates are configured to perform analog accumulation on charges corresponding to a bit position in the plurality of groups of partial products.

13. The circuit according to claim 12, wherein capacitances of capacitors coupled to a same group of AND gates are the same.

14. The circuit according to claim 1, wherein the analog addition circuit is further configured to:

perform analog accumulation on analog parameters corresponding to values of first bit positions in the plurality of groups of partial products;

multiply an accumulated analog parameter by a coefficient; and add a value obtained by accumulating analog parameters corresponding to values of second bit positions in the plurality of groups of partial products to obtain a summation analog parameter, wherein the first bit positions and the second bit positions are adjacent bit positions in the second bit position range.

15. The circuit according to claim 1, wherein a lowest bit position of the first bit position range is adjacent to a highest bit position of the second bit position range.

16. A multiplier-adder, comprising a circuit, the circuit comprising:

a multiplier comprising a plurality of word lines, a plurality of bit lines, and a plurality of storage units; and a digital addition circuit and an analog addition circuit coupled to the multiplier, wherein:

the digital addition circuit is configured to perform bitwise digital accumulation on bits that belong to a first bit position range and that are in a plurality of groups of partial products, wherein the plurality of groups of partial products are obtained by multiplying a plurality of first values by a plurality of second values, the first bit position range refers to S bit positions of a product value of one of the first values and one of the second values, S is a positive integer, and the product value is obtained by performing bitwise accumulation after a group of partial products are shifted; and the analog addition circuit is configured to perform bitwise analog accumulation on analog parameters corresponding to values of bits that belong to a second bit position range and that are in the plurality of groups of partial products, wherein the second bit position range refers to T bit positions that are of the product value and that do not overlap the first bit position range, T is a positive integer, and S+T is less than or equal to a quantity of bit positions of the product value.

17. The multiplier-adder according to claim 16, wherein the circuit further comprising an analog-to-digital converter, and wherein the analog-to-digital converter is configured to perform analog-to-digital conversion on at least one summation analog parameter output by the analog addition circuit to obtain at least one second summation value.

18. The multiplier-adder according to claim 17, wherein the circuit further comprising a shift circuit, and wherein the shift circuit is configured to:

shift the at least one second summation value and at least one first summation value output by the digital addition circuit; and sum values obtained after the shift.

19. The multiplier-adder according to claim 16, wherein the multiplier is configured to multiply the plurality of first values by the plurality of second values respectively to obtain the plurality of groups of partial products.

20. A circuit optimization method, applied to a multiplier-adder comprising a circuit comprising a digital addition circuit and an analog addition circuit, wherein:

the digital addition circuit is configured to perform bitwise digital accumulation on bits that belong to a first bit position range and that are in a plurality of groups of partial products, wherein the plurality of groups of partial products are obtained by multiplying a plurality of first values by a plurality of second values, the first bit position range refers to S bit positions of a product value of one of the first values and one of the second values, S is a positive integer, and the product value is obtained by performing bitwise accumulation after a group of partial products are shifted; and the analog addition circuit is configured to perform bitwise analog accumulation on analog parameters corresponding to values of bits that belong to a second bit position range and that are in the plurality of groups of partial products, the second bit position range refers to T bit positions that are of the product value and that do not overlap the first bit position range, T is a positive integer, and S+T is less than or equal to a quantity of bit positions of the product value; and the circuit optimization method comprises:

calculating power consumption of the multiplier-adder in each data pair, wherein each data pair comprises a first bit position range in which digital accumulation is performed by the multiplier-adder and a second bit position range in which analog accumulation is performed by the multiplier-adder; and generating an optimized multiplier-adder based on an optimal data pair, wherein the optimal data pair is the first bit position range and the second bit position range when power consumption of the multiplier-adder is at a lowest level.

* * * * *